(12) United States Patent
Starr et al.

(10) Patent No.: US 6,798,302 B2
(45) Date of Patent: Sep. 28, 2004

(54) ANALOG IMPLEMENTATION OF SPREAD SPECTRUM FREQUENCY MODULATION IN A PROGRAMMABLE PHASE LOCKED LOOP (PLL) SYSTEM

(75) Inventors: Gregory W. Starr, San Jose, CA (US); Wanli Chang, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/138,461

(22) Filed: May 3, 2002

(65) Prior Publication Data

US 2003/0160641 A1 Aug. 28, 2003

Related U.S. Application Data

(60) Provisional application No. 60/289,268, filed on May 6, 2001, and provisional application No. 60/289,245, filed on May 6, 2001.

(51) Int. Cl.[7] .............................................. H03B 29/00
(52) U.S. Cl. ........................... 331/78; 331/19; 375/200
(58) Field of Search ............................. 331/78, 23, 18, 331/19; 332/117, 120, 121, 122; 375/200

(56) References Cited

U.S. PATENT DOCUMENTS

| | | | | |
|---|---|---|---|---|
| 4,475,208 A | * | 10/1984 | Ricketts ......................... 375/1 |
| 4,521,744 A | | 6/1985 | Yamada et al. ............. 331/1 A |
| 5,058,204 A | | 10/1991 | Tahernia et al. ............ 455/183 |
| 5,144,173 A | | 9/1992 | Hui ............................. 327/284 |
| 5,256,980 A | | 10/1993 | Itri .............................. 328/104 |
| 5,291,515 A | * | 3/1994 | Uchida et al. ............... 375/142 |
| 5,319,735 A | * | 6/1994 | Preuss et al. ............... 395/2.14 |
| 5,453,706 A | | 9/1995 | Yee .............................. 326/93 |
| 5,583,884 A | * | 12/1996 | Maruyama et al. ......... 375/143 |
| 5,631,920 A | * | 5/1997 | Hardin ........................ 375/200 |
| 5,673,323 A | * | 9/1997 | Schotz et al. ................. 381/2 |
| RE35,650 E | * | 11/1997 | Partyka et al. .............. 375/206 |
| 5,712,595 A | | 1/1998 | Yokoyama ..................... 331/2 |
| 5,737,329 A | * | 4/1998 | Horiguchi ................... 370/342 |
| 5,872,807 A | * | 2/1999 | Booth et al. ................. 375/200 |
| 5,898,617 A | | 4/1999 | Bushey et al. ........... 365/185.2 |
| 5,914,980 A | * | 6/1999 | Yokota et al. .............. 375/200 |
| 6,046,603 A | | 4/2000 | New ............................. 326/38 |
| 6,046,646 A | | 4/2000 | Lo et al. ....................... 331/10 |
| 6,057,704 A | | 5/2000 | New et al. .................... 326/38 |
| 6,057,739 A | | 5/2000 | Crowley et al. .............. 331/14 |
| 6,081,164 A | | 6/2000 | Shigemori et al. ........... 331/16 |
| 6,091,263 A | | 7/2000 | New et al. .................... 326/40 |
| 6,181,158 B1 | | 1/2001 | Cheung et al. ............... 326/38 |
| 6,263,011 B1 | * | 7/2001 | Paik et al. ................... 375/149 |
| 6,275,077 B1 | | 8/2001 | Tobin et al. ................. 327/108 |
| 6,282,249 B1 | | 8/2001 | Tomesen et al. ............ 375/327 |
| 6,301,294 B1 | * | 10/2001 | Hara et al. ................... 375/152 |
| 6,366,174 B1 | | 4/2002 | Berry et al. ................... 331/78 |
| 6,389,092 B1 | | 5/2002 | Momtaz ...................... 375/376 |
| 6,417,739 B1 | | 7/2002 | Chacko ........................ 331/17 |
| 6,441,660 B1 | | 8/2002 | Ingino, Jr. .................. 327/156 |
| 6,462,594 B1 | | 10/2002 | Robinson et al. ........... 327/159 |

FOREIGN PATENT DOCUMENTS

| | | |
|---|---|---|
| EP | 0 655 829 A1 | 5/1995 |
| EP | 1 020 995 A1 | 7/2000 |

OTHER PUBLICATIONS

U.S. patent application Ser. No. 10/137,802, Starr, filed May 1, 2002.

* cited by examiner

Primary Examiner—Timothy P. Callahan
Assistant Examiner—An T. Luu
(74) Attorney, Agent, or Firm—Morrison & Foerster LLP (57) ABSTRACT

A PLL circuit is described. The PLL circuit includes: a signal generator; and a spread spectrum modulator coupled to the signal generator, where the spread spectrum modulator receives a control voltage as an input and provides a spread spectrum control voltage to the signal generator in response to the control voltage. In one embodiment, the spread spectrum modulator includes at least one selector, where the at least one selector selects a plurality of voltage levels that correspond to a spread mode and percentage of spread for the spread spectrum modulator.

31 Claims, 3 Drawing Sheets

ANALOG IMPLEMENTATION OF SPREAD SPECTRUM FREQUENCY MODULATION IN A PROGRAMMABLE PHASE LOCKED LOOP (PLL) SYSTEM

CROSS-REFERENCE TO RELATED APPLICATIONS

This application claims the benefits of U.S. Provisional Application Serial Nos. 60/289,268 and 60/289,245, filed May 6, 2001, and entitled "Programmable Loop Bandwidth In Phase Locked Loop (PLL) Circuit" and "Phase Lock Loop (PLL) And Delay Lock Loop (DLL) Counter And Delay Element Programming In User Mode", respectively.

This application is being filed concurrently with (1) the U.S. patent application of Gregory W. Starr and Wanli Chang for "Programmable Loop Bandwidth In Phase Locked Loop (PLL) Circuit", (2) the U.S. patent application of Gregory W. Starr, Yen-Hsiang Chang, and Edward P. Aung for "Phase Locked Loop (PLL) And Delay Locked Loop (DLL) Counter And Delay Element Programming In User Mode", and (3) the U.S. patent application of Wanli Chang and Gregory W. Starr for "Programmable Current Reference Circuit", and incorporates the material therein by reference.

BACKGROUND OF THE INVENTION

1. Field of the Invention

This invention relates generally to electronic circuits and, in particular, to phase locked loop and delay locked loop circuits used in electronic circuits.

2. Description of the Related Art

Consumer and commercial electronics must meet FCC electromagnetic emissions standards. PLL circuits, like other electronic circuits, also generate electromagnetic emissions that must meet FCC standards. In some existing systems, this is accomplished by adding expensive and heavy shielding. In other existing systems, it is accomplished by implementing a digital spread spectrum technique where a clock signal has its frequency modulated in a controlled manner around a center frequency. As noted above, the shielding technique is expensive and physically heavy. On the other hand, the digital spread spectrum technique is rigid as it involves setting counters (or dividers) to one set of predetermined values, and changing the counter settings to a second set of predetermined values to achieve a predetermined frequency modulation.

Another existing system, uses analog spread spectrum modulation of currents. There are a number of disadvantages of using current modulation. One, it is difficult to generate a triangular waveform with current modulation. Second, the output of the current modulation is a current which is not the most desirable parameter with which to control a voltage controlled oscillator.

The present invention addresses this and other disadvantages of existing current reference circuits.

SUMMARY OF THE INVENTION

The present invention uses an analog approach to modulate the control voltage in a phase locked loop. One aspect of the analog approach of the present invention, unlike the existing digital approach, provides a more controlled modulation without having to resort to resetting counters to specific predetermined values. Thus, the analog approach de-couples the counters from the modulation, providing a more flexible modulation scheme. One aspect of the spread spectrum modulator of the present invention allows for easily changing the spread mode (i.e., the type of spread) and the percentage of spread provided by the spread spectrum modulator. Another aspect of the spread spectrum modulator of the present invention provides for additional filtering that may be included to reduce high frequency spurs. In another aspect, the spread spectrum modulator of the present invention provides spread spectrum modulation independent of the process, supply voltage, and temperature.

The present invention encompasses a PLL circuit. In one embodiment, the PLL circuit of the present invention includes: a signal generator; and a spread spectrum modulator coupled to the signal generator, where the spread spectrum modulator receives a control voltage as an input and provides a spread spectrum control voltage to the signal generator in response to the control voltage. In one embodiment, the spread spectrum modulator includes at least one selector, where the at least one selector selects a plurality of voltage levels that correspond to a spread mode and percentage of spread for the spread spectrum modulator.

In one embodiment, the phase locked loop circuit includes a spread spectrum modulator, where the spread spectrum modulator comprises a voltage divider and a selector coupled to the voltage divider, where the selector selects a plurality of voltages that correspond to a spread rate and percentage of spread for the spread spectrum modulator. In one embodiment, the selector includes a plurality of multiplexers, where a first multiplexer of the plurality of multiplexers selects a high voltage, a second multiplexer of the plurality of multiplexers selects a low voltage, and a third multiplexer of the plurality of multiplexers selects a reference voltage.

The present invention is explained in more detail below with reference to the drawings.

DETAILED DESCRIPTION OF THE INVENTION

The present invention comprises a PLL circuit with an analog spread spectrum modulator. The following description is presented to enable any person skilled in the art to make and use the invention, and is provided in the context of a particular application and its requirements. Various modifications to the embodiments shown will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention is primarily described and claimed with reference to a PLL circuit. It is to be noted, however, that PLL and delay locked loop (DLL) circuits are herein used interchangeably. Therefore, references herein to a PLL circuit, either in the description or claims, are not limited to PLL circuits but encompass DLL circuits as well.

Figure 1:
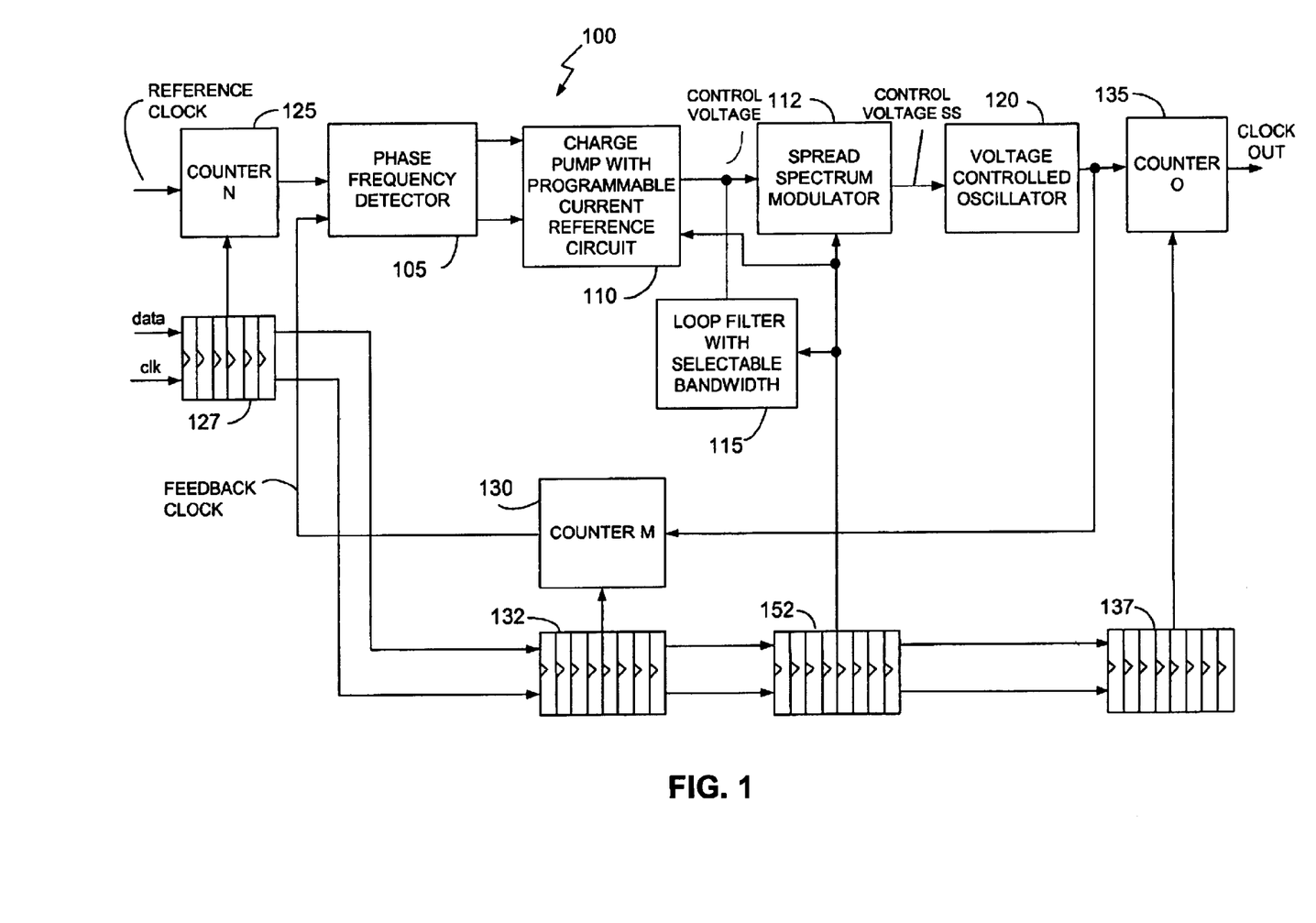
FIG. 1 is a block diagram of one embodiment of the PLL circuit of the present invention.

FIG. 1 is a block diagram of one embodiment of the PLL circuit 100 of the present invention. In FIG. 1, the PLL circuit 100 includes a phase frequency detector (PFD) 105, a charge pump (CP) 110 with a programmable current reference circuit, an analog spread spectrum modulator 112, a loop filter 115 with a selectable bandwidth, a voltage controlled oscillator (VCO) 120, counter N 125, counter M 130, and counter O 135.

Also shown in FIG. 1, are shift registers 127, 132, 152, and 137, which in one embodiment include D-type flip-flops. Shift registers 127, 132, and 137 are coupled to counter N 125, counter M 130, and counter O 135, respectively. In one embodiment, shift registers 152 is coupled to the CP 110, the loop filter 115, and the spread spectrum modulator 112. In one embodiment, shift registers 152 are coupled to corresponding hold registers of the CP 110, the loop filter 115, and the spread spectrum modulator 112.

The loop filter 115 with selectable bandwidth may also herein be referred to as a loop filter with programmable bandwidth (or programmable bandwidth loop filter) or a loop filter with variable bandwidth (or variable bandwidth loop filter). The loop filter 115 with programmable bandwidth allows an effective shift in the open loop bandwidth of the PLL circuit. In one embodiment, the loop filter 115 bandwidth is programmable in user mode using the shift registers 152. The U.S. patent application of Gregory W. Starr and Wanli Chang for "Programmable Loop Bandwidth In Phase Locked Loop (PLL) Circuit", which is filed concurrently with this application and is incorporated herein by reference, describes such a loop filter with a programmable bandwidth.

Counters N, M, and O may also be referred to as dividers N, M, and O. The output of each of dividers N, M and O is equal to its respective input divided by N, M, and O, respectively. In one embodiment, each of N, M, and O are integers. In another embodiment, N, M, and O may be non-integers. In one embodiment, each of N, M, and O are equal to one. In another embodiment, the PLL may be without one or more of the dividers N, M, and O. In one embodiment, each of counters N, M, and O and their associated delays may be programmed in user mode, i.e., their count and delay settings may be programmed in user mode. The U.S. patent application of Gregory W. Starr, Yen-Hsiang Chang, and Edward P. Aung for "Phase Locked Loop (PLL) And Delay Locked Loop (DLL) Counter And Delay Element Programming In User Mode", which is filed concurrently with this application and is incorporated herein by reference, describes such counters.

In one embodiment, the CP 110 with a programmable current reference circuit is programmable in user mode using the shift registers 152. The CP 110 with a programmable current reference circuit is described in greater detail in the U.S. patent application of Wanli Chang and Gregory W. Starr for "Programmable Current Reference Circuit" which is filed concurrently with this application and is incorporated herein by reference. In another embodiment, a CP without a programmable current reference circuit, but with a conventional current reference circuit, may be used in the PLL circuit 100 of the present invention.

The PFD 105 compares the feedback clock signal with a divided version of the reference clock signal, i.e., after the reference clock signal is passed through divider N 125. Depending on the difference between the two signals compared by the PFD 105 (i.e., depending on whether the VCO 120 needs to operate at a higher or lower frequency), either an up or down signal is provided to the charge pump 110. In response, the charge pump 110 increases current supplied to the loop filter 115 or reduces current in the loop filter 115.

As a result, a higher or lower control voltage ($V_{CTRL}$) is applied to the spread spectrum modulator 112. The spread spectrum modulator 112 spread spectrum modulates the control voltage to produce the control voltage SS ($V_{CTRL\_SS}$), a spread spectrum control voltage. The VCO 120 generates a signal (e.g., a waveform) whose frequency depends on the control voltage (or more specifically, the control voltage SS).

Figure 2:
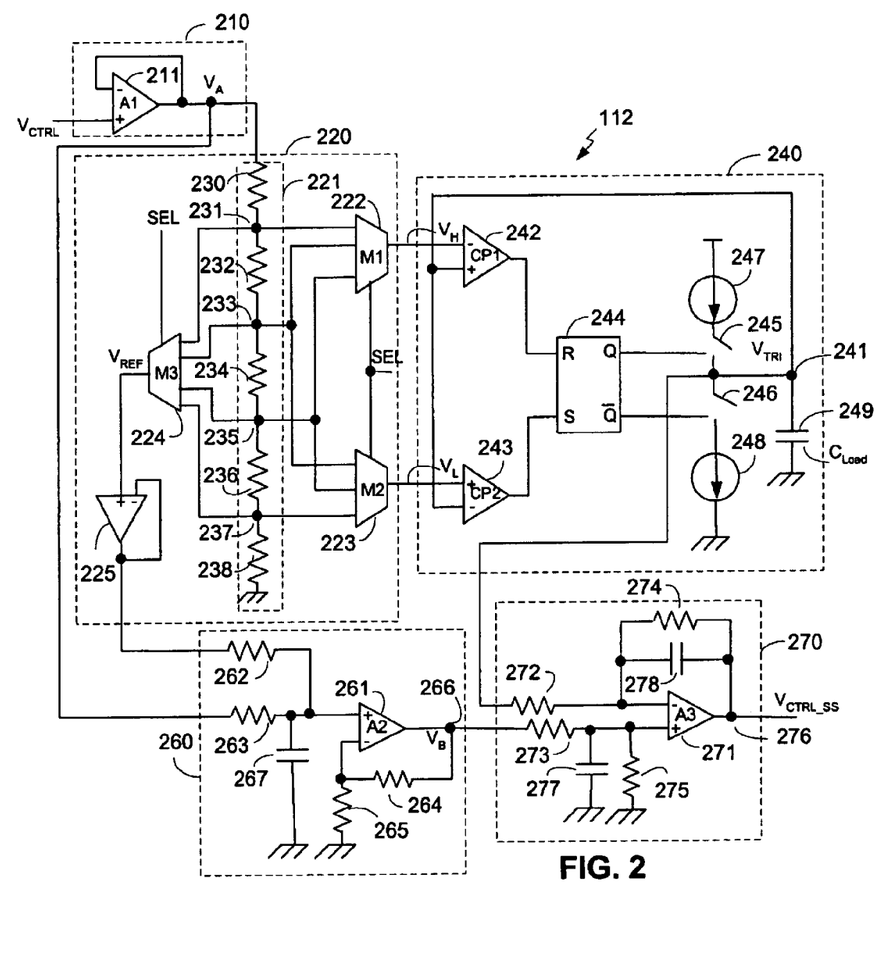
FIG. 2 is a circuit diagram of the analog spread spectrum modulator of the present invention.

FIG. 2 is a circuit diagram of the analog spread spectrum modulator 112 of the present invention. Analog spread spectrum modulator 112 comprises a buffer 210, a voltage level selector 220, a waveform generator 240, a voltage adder 260, and a voltage subtracter 270. The buffer 210 is coupled to the voltage level selector 220 and the voltage adder 260. The voltage level selector 220 is in turn coupled to the waveform generator 240 and the voltage adder 260. The waveform generator 240 and the voltage adder 260 are both coupled to the voltage subtracter 270.

The buffer 210 comprises an amplifier 211, which in one embodiment is an operational amplifier with unity gain. Buffer 210 is intended to prevent excessive loading on the control voltage. (It is to be noted, however, that in one embodiment, the buffer 210 may be excluded from the analog spread spectrum modulator 112.) The minus (or inverting) input terminal of amplifier 211 is coupled to the output terminal of amplifier 211. The control voltage is input to the plus (or noninverting) input terminal of amplifier 211. The output of amplifier 211 is $V_A$. In one embodiment where amplifier 211 has unity gain, $V_A$ is simply a buffered version of $V_{CTRL}$. Thus, the following relation holds between $V_A$ and $V_{CTRL}$:

$$V_A = V_{CTRL} \qquad\qquad \text{(Eqn. 1)}.$$

The voltage level selector 220 comprises a voltage divider 221 and multiplexers 222, 223, and 224. Voltage divider 221 comprises a resistor network with a series of resistors, more specifically resistors 230, 232, 234, 236, and 238. Node 231 is between resistors 230 and 232. Node 233 is between resistors 232 and 234. Node 235 is between resistors 234 and 236. Node 237 is between resistors 236 and 238. Voltage divider 221 divides down the voltage $V_A$. Accordingly, the voltages at nodes 231, 233, 235, and 237 are progressively lower. Furthermore, each of the voltages at nodes 231, 233, 235, and 237 is less than $V_A$.

The voltages at nodes 231, 233, and 235 are used as inputs to multiplexer 222. The voltages at nodes 233, 235, and 237 are used as inputs to multiplexer 223. The voltages at nodes 231, 233, 235, and 237 are used as inputs to multiplexer 224. Each of multiplexers 222, 223, and 224 selects one of its inputs as an output. The selection is done in response to the select (SEL) signals applied to multiplexers 222, 223, and 224. In one embodiment, the selection may be done in user mode using shift registers 152. The outputs of multiplexers 222, 223, and 224 are $V_H$, $V_L$, and $V_{REF}$. Below are equations relating $V_H$, $V_L$, and $V_{REF}$ with $V_{CTRL}$:

$$V_H = A V_{CTRL} \qquad\qquad \text{(Eqn. 2)};$$

$$V_L = B V_{CTRL} \qquad\qquad \text{(Eqn. 3)};$$

$$V_{REF} = C V_{CTRL} \qquad\qquad \text{(Eqn. 4)};$$

where A is less than 1, B is less than A and less than 1, and C is less than 1.

The values of A, B, and C, each depend on resistances of resistors 230, 232, 234, 236, and 238. Additionally, their values depend on which of the input signals to multiplexers 222, 223, and 224 are selected to be output. The voltages $V_H$, $V_L$, and $V_{REF}$ determine the spread mode and modulation range (i.e., percentage spread). Thus, the voltage divider 221 in combination with the multiplexers 222, 223, and 224 and SEL signals set the spread mode, modulation range (i.e., percentage spread), and the reference voltage. It is to be noted that changing the SEL signals allows for changing the voltages $V_H$, $V_L$, and $V_{REF}$, and, therefore, the spread mode and the percentage spread. In one embodiment, the SEL signals are chosen by the user to achieve the desired spread mode and percentage spread. In one embodiment, this selection may be done in user mode using shift registers 152.

In the embodiment shown in FIG. 2, there are five resistors in the voltage divider 221. In another embodiment, there may be a different number of resistors in the voltage divider 221. For example, there may be more than 5 resistors in the voltage divider. Having more resistors in the voltage divider provides for a larger number of voltage levels from which the multiplexers 222, 223, and 224 may select. This provides greater flexibility in configuring (or programming) the analog spread spectrum modulator 112 because it provides for a greater number of options in selecting the voltages $V_H$, $V_L$, and $V_{REF}$, and, therefore, the spread mode and percentage spread.

The waveform generator 240 receives $V_H$ and $V_L$ as inputs and provides a voltage waveform $V_{TRI}$ (which in one embodiment is a triangular voltage waveform) as an output at node 241. The waveform generator 240 comprises comparators 242 and 243, a set-reset flip-flop 244, switches 245 and 246, current sources 247 and 248, and capacitor $C_{LOAD}$ 249.

Comparator 242 compares $V_H$ (received at the inverting input terminal of the comparator 242) with $V_{TRI}$ (received at the noninverting input terminal of the comparator 242) and provides an output to the reset (R) input terminal of the set-reset flip-flop 244. Accordingly, comparator 242 provides a high output at the reset input terminal of the set-reset flip-flop 244 when $V_{TRI}$ is greater than $V_H$. Similarly, comparator 242 provides a low output at the reset input terminal of the set-reset flip-flop 244 when $V_{TRI}$ is less than or equal to $V_H$.

Comparator 243 compares $V_L$ (received at the noninverting input terminal of the comparator 243) with $V_{TRI}$ (received at the inverting input terminal of the comparator 243) and provides an output to the set (S) input terminal of the set-reset flip-flop 244. Accordingly, comparator 243 provides a high output at the set input terminal of the set-reset flip-flop 244 when $V_L$ is greater than $V_{TRI}$. Similarly, comparator 243 provides a low output at the set input terminal of the set-reset flip flop 244 when $V_{TRI}$ is equal to or greater than $V_L$.

In equations 2 and 3 above, which define $V_H$ and $V_L$, B is less than A. Therefore, $V_H$ is greater than $V_L$. As a result, at any given time $V_{TRI}$ is not both greater than $V_H$ and less than $V_L$. Instead, $V_{TRI}$ is usually between $V_H$ and $V_L$. In other words, it is less than or equal to $V_H$ and greater than or equal to $V_L$. Thus, most of the time, the outputs of both comparators 242 and 243 are low. Under this condition, the output of the set-reset flip-flop is not changed. As such, one of switches 245 and 246 is closed, while the other is open, and current is either being supplied to or sunk from node 241.

It is to be noted that supplying current to or sinking current from node 241 involves supplying current (or charge) to or sinking current (or charge) from capacitor $C_{LOAD}$ 249. Thus, supplying current to or sinking current from node 241 is herein used interchangeably with supplying current (or charge) to or sinking current (or charge) from capacitor $C_{LOAD}$ 249.

If current is supplied to node 241, $V_{TRI}$ is increased. When $V_{TRI}$ is greater than $V_H$, comparator 242 provides a high output at the reset input terminal of set-reset flip-flop 244. Moreover, when $V_{TRI}$ is greater than $V_H$, it is also greater than $V_L$, and therefore, the output of comparator 243 to the set input terminal of set-reset flip-flop 244 is low. Accordingly, when $V_{TRI}$ is greater than $V_H$, Q is reset to low (or 0). As a result, switch 245 is opened and switch 246 is closed. Thus, current from node 241 is drained by way of switch 246 and current source 248. Draining current from node 241 decreases $V_{TRI}$. $V_{TRI}$ is decreased until it becomes less than $V_L$.

When $V_{TRI}$ is less than $V_L$, comparator 243 provides a high output at the set input terminal of set-reset flip-flop 244. Moreover, when $V_{TRI}$ is less than $V_L$, it is also less than $V_H$, and therefore, the output of comparator 242 to the reset input terminal of set-reset flip-flop 244 is low. Accordingly, when $V_{TRI}$ is less than $V_L$, Q is set to high (or 1). As a result, switch 245 is closed and switch 246 is opened. Thus, current is supplied to node 241 from current source 247 by way of switch 245. Supplying current to node 241 increases $V_{TRI}$. $V_{TRI}$ is increased until it becomes greater than $V_H$.

In the embodiment shown in FIG. 2, set-reset flip-flop 244 is used to determine the states of switches 245 and 246 based on the outputs of comparators 242 and 243. In another embodiment, some other register instead of set-reset flip-flop 244 may be used to serve the function of set-reset flip-flop 244. For example, in another embodiment, a D-type flip-flop may be used in place of set-reset flip-flop 244.

In one embodiment, $V_H$ is the high (or maximum) voltage of a triangular voltage waveform (i.e., $V_{TRI\_max}$), $V_L$ is the low (or minimum) voltage of a triangle voltage waveform (i.e., $V_{TRI\_min}$), and $V_{REF}$ is the reference or base voltage of a triangle voltage waveform. In other words, the following relations exist between $V_H$, $V_L$, $V_{TRI\_max}$, and $V_{TRI\_min}$:

$$V_{TRI\_max} = V_H = AV_{CTRL} \quad \text{(Eqn. 5); and}$$

$$V_{TRI\_min} = V_L = BV_{CTRL} \quad \text{(Eqn. 6).}$$

It is to be noted that for a brief period of time $V_{TRI\_max}$ and $V_{TRI\_min}$ will be above $V_H$ and below $V_L$, respectively. As noted above, when $V_{TRI}$ is greater than $V_H$, Q is reset to low (or 0). As a result, switch 245 is opened and switch 246 is closed. Thus, current from node 241 is drained by way of switch 246 and current source 248. Draining current from node 241 decreases $V_{TRI}$. $V_{TRI}$ is decreased until it becomes less than $V_L$. Similarly, as noted above, when $V_{TRI}$ is less than $V_L$, Q is set to high (or 1). As a result, switch 245 is closed and switch 246 is opened. Thus, current is supplied to node 241 from current source 247 by way of switch 245. Supplying current to node 241 increases $V_{TRI}$. $V_{TRI}$ is increased until it becomes greater than $V_H$.

In one embodiment, current sources 247 and 248 are programmable to provide different current levels. In one embodiment, this programmability is achieved by using a programmable current reference circuit in conjunction with the current sources 247 and 248. In one embodiment, current sources 247 and 248 are programmable in user mode using shift registers 152. As noted above a programmable current reference circuit is described in greater detail in the U.S. patent application of Wanli Chang and Gregory W. Starr for "Programmable Current Reference Circuit", which is filed concurrently with this application and is incorporated herein by reference.

Similarly, in one embodiment, capacitor $C_{LOAD}$ 249 is programmable. In one embodiment, the capacitor is programmable in user mode using shift registers 152. A programmable capacitor is described in the U.S. patent application of Gregory W. Starr and Wanli Chang for "Programmable Loop Bandwidth In Phase Locked Loop (PLL) Circuit", which is filed concurrently with this application and is incorporated herein by reference.

The currents provided by and sunk by current sources 247 and 248, respectively, and the capacitance of capacitor $C_{LOAD}$ 249 determine the speeds at which $V_{TRI}$ is increased to $V_H$ or decreased to $V_L$. The speeds at which $V_{TRI}$ is increased to $V_H$ or decreased to $V_L$ determines the spread rate (i.e., the distance between two consecutive $V_{TRI\_max}$'s or $V_{TRI\_min}$'s) of $V_{TRI}$.

Voltage adder 260 (or summing amplifier 260) comprises amplifier 261 (which in one embodiment is an operational amplifier) and resistors 262, 263, 264, and 265. Resistor 264 is coupled to the output node 266 and the inverting input terminal of the amplifier 261. Resistor 265 is coupled between the inverting input terminal of the amplifier 261 and ground. Both of resistors 262 and 263 are coupled to the noninverting input terminal of the amplifier 261. Resistor 262 is coupled to the output of multiplexer 224 which outputs $V_{REF}$. In one embodiment, there may be a buffer, such as buffer 225 shown in FIG. 2, between the output of multiplexer 224 and resistor 262. Buffer 225 is intended to prevent loading multiplexer 224. Similarly, resistor 263 is coupled to the output of amplifier 211 which outputs $V_A$. As both $V_A$ and $V_{REF}$ are applied to the noninverting input terminal of amplifier 261 via resistors 263 and 262, respectively, amplifier 261 combines $V_A$ and $V_{REF}$. The output voltage $V_B$ of amplifier 261 is the sum of $V_A$ and $V_{REF}$. In one embodiment, the resistances of resistors 262, 263, 264, and 265 are selected such that there is a unity gain factor between $V_B$ and the sum of $V_A$ and $V_{REF}$. In one embodiment, the resistance of resistor 262 is equal to that of resistor 263. Similarly, the resistance of resistor 264 is equal to that of resistor 265. It is to be noted that in another embodiment, some other relationship may exist between these resistors. Using equations 1 and 4 above, the following equation is derived for $V_B$:

$$V_B = V_A + V_{REF} = V_{CTRL} + CV_{CTRL} = V_{CTRL}(1+C) \quad \text{(Eqn. 7)}.$$

Voltage subtracter 270 (or differential amplifier 270) comprises amplifier 271 (which in one embodiment is an operational amplifier) and resistors 272, 273, 274, and 275. Resistor 274 is coupled to the output node 276 and the inverting input terminal of the amplifier 271. Resistor 275 is coupled between the noninverting input terminal of the amplifier 271 and ground. Resistor 272 is coupled to node 241 (which provides the voltage $V_{TRI}$) and the inverting input terminal of the amplifier 271. Resistor 273 is coupled to the output node 266 of the amplifier 261 (which provides the voltage $V_B$) and the noninverting input terminal of the amplifier 271. As $V_B$ and $V_{TRI}$ are applied to the noninverting and inverting input terminals of amplifier 271, respectively, via resistors 273 and 272, respectively, amplifier 271 subtracts $V_{TRI}$ from $V_B$. The output voltage $V_{CTRL\_SS}$ of amplifier 271 is the difference between $V_B$ and $V_{TRI}$. In one embodiment, the resistances of resistors 272, 273, 274, and 275 are selected such that there is a unity gain factor between $V_{CTRL\_SS}$ and the difference between $V_B$ and $V_{TRI}$. In one embodiment, the resistance of resistor 273 is equal to that of resistor 272. Similarly, the resistance of resistor 275 is equal to that of resistor 274. Moreover, the resistance of resistor 272 is equal to that of resistor 274. It is to be noted that in another embodiment, some other relationship may exist between these resistors. Using equation 7 above, the following equation is derived for $V_{CTRL\_SS}$:

$$V_{CTRL\_SS} = V_B - V_{TRI} = V_{CTRL}(1+C) - V_{TRI} \quad \text{(Eqn. 8)}.$$

As noted above, in one embodiment, the resistances of resistors 262, 263, 264, and 265 are selected such that there is a unity gain factor between $V_B$ and the sum of $V_A$ and $V_{REF}$. Similarly, in one embodiment, the resistances of resistors 272, 273, 274, and 275 are selected such that there is a unity gain factor between $V_{CTRL\_SS}$ and the difference between $V_B$ and $V_{TRI}$. In another embodiment, other resistance values may be selected so as to provide a desired non-unity gain factor.

In one embodiment, one or more of the resistors 230, 232, 234, 236, 238, 262, 263, 264, 265, 272, 273, 274, and 275 is programmable. In one embodiment, these resistors are programmable in user mode using shift registers 152. A programmable resistor is described in the U.S. patent application of Gregory W. Starr and Wanli Chang for "Programmable Loop Bandwidth In Phase Locked Loop (PLL) Circuit", which is filed concurrently with this application and is incorporated herein by reference. The programmability of these resistors allows for selecting different voltage levels for $V_H$, $V_L$, and $V_{REF}$, without changing the SEL signals of the voltage selector 220. It also allows greater flexibility in selecting a spread mode and percentage of spread. Additionally, it allows for greater flexibility in selecting gain factors for the voltage adder 260 and voltage subtracter 270.

In one embodiment, filter(s) may be added in the voltage path from $V_{CTRL}$ to $V_{CTRL\_SS}$ to reduce high frequency spurs in $V_{CTRL}$. Such filter(s), for example, may be added by modifying the voltage adder 260 and/or the voltage subtracter 270. For example, adding a capacitor, such as capacitor 267 shown in FIG. 2, to voltage adder 260 would cause the voltage adder 260 to act as a low pass filter. Similarly, adding capacitors, such as capacitors 277 and 278 shown in FIG. 2, to voltage subtracter 270 would cause the voltage subtracter 270 to act as a low pass filter.

Using equations 5, 6, and 8, the following equations are derived for the maximum value for $V_{CTRL}$ ($V_{CTRL\_SS\_max}$) and the minimum value for $V_{CTRL}$ ($V_{CTRL\_SS\_min}$):

$$V_{CTRL\_SS\_max} = V_B - V_{TRI\_min} = V_{CTRL}(1+C) - BV_{CTRL} = V_{CTRL}(1+C-B) \quad \text{(Eqn. 9)};$$

and $$V_{CTRL\_SS\_min} = V_B - V_{TRI\_max} = V_{CTRL}(1+C) - AV_{CTRL} = V_{CTRL}(1+C-A) \quad \text{(Eqn. 10)}.$$

The spread spectrum modulator 112 allows the spread mode to be varied. There are three typical spread modes: down spread, center spread, and up spread. Examples of these three modes are summarized in Table 1 below.

TABLE 1

Example of the various spread modes

| Spread Mode | Non-Spread frequency | % spread | maximum frequency | minimum frequency |
| --- | --- | --- | --- | --- |
| Down Spread | 100 Mhz | 0.5% | 100 MHz | 99.5 MHz |
| Center Spread | 100 MHz | 0.5% | 100.25 MHz | 99.75 MHz |
| Up Spread | 100 MHz | 0.5% | 100.5 MHz | 100 MHz |

In Table 1, each of the spread modes has a non-spread frequency of 100 MHz and a 0.5% spread. In the case of down spread, the maximum and minimum frequencies are 100 MHz and 99.5 MHz, respectively. In the case of center spread, the maximum and minimum frequencies are 100.25 MHz and 99.75 MHz, respectively. In the case of up spread, the maximum and minimum frequencies are 100.5 MHz and 100 MHz, respectively.

Figure 3:
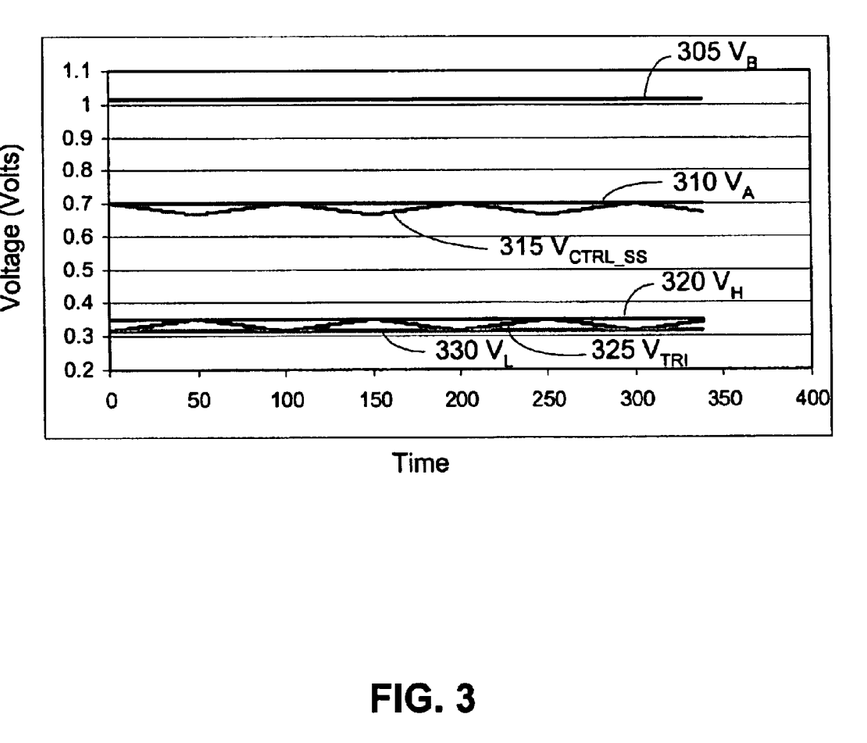
FIG. 3 is graph of calculated voltages versus time for some of the voltages designated in FIG. 2.

FIG. 3 is graph of calculated voltages versus time for some of the voltages designated in FIG. 2. The graph in FIG. 3 include waveforms 305, 310, 315, 320, 325, and 330 which represent voltages $V_B$, $V_A$, $V_{CTRL\_SS}$, $V_H$, $V_{TRI}$, and $V_L$. In FIG. 3, the horizontal axis represents time. The unit of time and the numbers on the time scale depend on the spread rate of the triangular waveforms, i.e., the distance or time between the occurrence of two consecutive peaks (highest values) in a triangular waveform.

The PLL circuit of the present invention may be used in many systems. For example, the PLL circuit may be used in a digital system. More specifically, the PLL circuit may be used in a digital system comprising a programmable logic device (PLD), which as used herein also refers to complex PLD's (CPLD's). Additionally, the PLL circuit may be used in a PLD. In one embodiment, the PLL circuit is on the same die/chip as the PLD. As used herein a digital system is not intended to be limited to a purely digital system, but also encompasses hybrid systems that include both digital and analog subsystems. Thus, the present invention encompasses digital systems that include the PLL circuit described herein.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. A phase locked loop circuit comprising:
   a signal generator; and
   a spread spectrum modulator coupled to the signal generator, wherein the spread spectrum modulator comprises at least one selector, wherein the at least one selector selects a plurality of voltage levels that correspond to a spread mode and percentage of spread for the spread spectrum modulator and further wherein the spread spectrum modulator receives a control voltage as an input and provides a spread spectrum control voltage to the signal generator in response to the control voltage.

2. The phase locked loop circuit of claim 1, wherein the at least one selector selects a high voltage, a low voltage, and a reference voltage for the spread spectrum modulator.

3. The phase locked loop circuit of claim 2, wherein the at least one selector selects the high voltage, the low voltage, and the reference voltage for the spread spectrum modulator in user mode.

4. The phase locked loop circuit of claim 2, wherein the spread spectrum modulator comprises a voltage divider coupled to the at least one selector, the at least one selector comprising a plurality of multiplexers, the voltage divider comprising a plurality of resistors coupled in series, wherein a first plurality of nodes from the voltage divider are coupled to a first multiplexer of said plurality of multiplexers, a second plurality of nodes from voltage divider are coupled to a second multiplexer of said plurality of multiplexers, and a third plurality of nodes from the voltage divider are coupled to a third multiplexer of said plurality of multiplexers, further wherein the first, second, and third multiplexers output the high voltage, the low voltage, and the reference voltage respectively.

5. The phase locked loop circuit of claim 4, wherein the spread spectrum modulator comprises:
   a buffer coupled to the voltage divider;
   a waveform generator coupled to the plurality of multiplexers;
   a voltage adder coupled to the plurality of multiplexers and the buffer; and
   a voltage subtracter coupled to the voltage adder and the waveform generator.

6. The phase locked loop circuit of claim 5, wherein the waveform generator comprises:
   a first comparator, wherein the first comparator compares a voltage at an output node of the waveform generator with the high voltage;
   a second comparator, wherein the second comparator compares the voltage at the output node with the low voltage;
   a flip-flop coupled to the first and second comparators;
   a first switch coupled to a first output node of the flip-flop; and
   a second switch coupled to a second output node of the flip-flop;
   a first current source coupled to the first switch, the first current source for increasing current at the output node; and
   a second current source coupled to the second switch, the second current source for sinking current from the output node.

7. The phase locked loop circuit of claim 6, wherein the waveform generator is programmable to provide different spread rates.

8. The phase locked loop circuit of claim 6, wherein the voltage adder comprises an operational amplifier, wherein the voltage adder receives the reference voltage and an output of the buffer at a positive input node and provides a voltage adder output that is a sum of the reference voltage and the output of the buffer.

9. The phase locked loop circuit of claim 8, wherein the voltage subtracter comprises an operational amplifier, wherein the voltage subtracter subtracts the voltage at the output node of the waveform generator from the voltage adder output.

10. The phase locked loop circuit of claim 1, wherein the spread spectrum modulator comprises a waveform generator.

11. The phase locked loop circuit of claim 10, wherein the waveform generator comprises:
   a first comparator, wherein the first comparator compares a voltage at an output node of the waveform generator with a high voltage;
   a second comparator, wherein the second comparator compares the voltage at the output node with a low voltage;
   a flip-flop coupled to the first and second comparators;
   a first switch coupled to a first output node of the flip-flop; and
   a second switch coupled to a second output node of the flip-flop;

a first current source coupled to the first switch, the first current source for increasing current at the output node; and a second current source coupled to the second switch, the second current source for sinking current from the output node.

12. The phase locked loop circuit of claim 10, wherein the spread spectrum modulator further comprises:

a voltage subtracter coupled to the waveform generator; and a voltage adder coupled to the voltage subtracter.

13. A digital system including a programmable logic device and the phase locked loop circuit of claim 1.

14. A programmable logic device including the phase locked loop circuit of claim 1.

15. A phase locked loop circuit comprising a spread spectrum modulator, the spread spectrum modulator comprising a voltage divider and a selector coupled to the voltage divider, wherein the selector selects a plurality of voltages that correspond to a spread rate and percentage of spread for the spread spectrum modulator.

16. The phase locked loop circuit of claim 15, wherein the selector comprises a plurality of multiplexers, wherein a first multiplexer of the plurality of multiplexers selects a high voltage, a second multiplexer of the plurality of multiplexers selects a low voltage, and a third multiplexer of the plurality of multiplexers selects a reference voltage.

17. The phase locked loop circuit of claim 16, wherein the voltage divider comprises a plurality of resistors coupled in series.

18. The phase locked loop circuit of claim 17, wherein the spread spectrum modulator further comprises:

a buffer coupled to the voltage divider;

a waveform generator coupled to the selector, wherein the waveform generator receives the high voltage and low voltage as an input and provides a waveform generator output at a waveform generator output node;

a voltage adder coupled to the buffer and the selector, wherein the voltage adder receives the reference voltage from the selector and a buffered version of a control voltage from the buffer, further wherein the voltage adder provides a voltage adder output voltage that is a sum of the reference voltage and the buffered version of the control voltage;

a voltage subtracter coupled to the waveform generator, wherein the voltage subtracter receives the waveform generator output and the voltage adder output, subtracts the waveform generator output from the voltage adder output, and provides a spread spectrum control voltage as an output.

19. The phase locked loop circuit of claim 18, wherein the waveform generator comprises:

a first comparator, wherein the first comparator compares the waveform generator output with the high voltage;

a second comparator, wherein the second comparator compares the waveform generator output with the low voltage;

a flip-flip coupled to the first and second comparators;

a first switch coupled to a first output node of the flip-flop; and a second switch coupled to a second output node of the flip-flop;

wherein the first switch is coupled to a first current source for increasing current at the waveform generator output node, and wherein the second switch is coupled to a second current source for sinking current from the waveform generator output node.

20. The phase locked loop circuit of claim 19, wherein the voltage adder comprises an operational amplifier, wherein the voltage adder receives the reference voltage and an output of the buffer at a noninverting input terminal, further wherein the voltage subtracter comprises an operational amplifier, wherein the voltage subtracter receives the waveform generator output at an inverting input terminal and the voltage adder output at a noninverting input terminal.

21. The phase locked loop of claim 18 further comprising:

a detector;

a charge pump filter coupled to the detector and the spread spectrum modulator;

a loop filter coupled to the charge pump and the spread spectrum modulator;

a first divider coupled to the signal generator and a first input node of the detector, wherein the first divider receives a signal generator output signal from the signal generator and provides a first input signal to the first input node of the detector;

a second divider coupled to a second input node of the detector;

a third divider coupled to the signal generator; and wherein the second divider receives a reference clock signal and provides a second input signal to the second input node of the detector, further wherein the third divider receives the signal generator output signal from the signal generator and provides an output clock signal.

22. A digital system including a programmable logic device and the phase locked loop circuit of claim 18.

23. A programmable logic device including the phase locked loop circuit of claim 18.

24. A method of providing an output clock signal, the method comprising:

spreading a control voltage utilizing an analog voltage controlled spread spectrum modulator to provide a spread spectrum control voltage, wherein the spreading comprises selecting a plurality of voltage levels that correspond to a spread rate and percentage of spread; and generating an output clock signal in response to the spread spectrum control voltage.

25. The method of claim 24, wherein the spreading comprises:

dividing the control voltage to provide the plurality of voltage levels;

selecting a high voltage, a low voltage, and a reference voltage from the plurality of voltage levels;

generating a voltage waveform in response to the high voltage and the low voltage;

adding the reference voltage with a buffered version of the control voltage to provide a sum voltage; and subtracting the voltage waveform from the sum voltage to provide the spread spectrum control voltage.

26. The method of claim 25 further comprising:

comparing a feedback clock signal with a reference clock signal to provide the control voltage.

27. The method of claim 24, wherein the spreading comprises:

generating a voltage waveform in response to a high voltage and a low voltage;

adding a reference voltage with the control voltage to provide a sum voltage; and subtracting the voltage waveform from the sum voltage to provide the spread spectrum control voltage.

28. A phase locked loop comprising:

means for spreading a control voltage, wherein said means for spreading comprises:

a means for selecting, further wherein said means for spreading uses analog voltage controlled spread spectrum modulation and provides a spread spectrum control voltage;

means for dividing the control voltage to provide a plurality of voltage levels, wherein the means for dividing is coupled to the means for selecting, wherein the means for selecting selects a high voltage, a low voltage, and a reference voltage from the plurality of voltage levels;

means for generating a voltage waveform coupled to the means for selecting, wherein the means for generating a voltage waveform generates a voltage waveform in response to the high voltage and the low voltage;

means for adding coupled to the means for selecting, wherein the means for adding adds the reference voltage with a buffered version of the control voltage to provide a sum voltage; and     means for subtracting coupled to the means for adding and the means for generating a voltage waveform, wherein the means for subtracting subtracts the voltage waveform from the sum voltage to provide the spread spectrum control voltage; and means for generating an output clock signal, wherein the means for generating generates the output clock signal in response to the spread spectrum control voltage.

29. The phase locked loop of claim 28 further comprising means for comparing coupled to the means for generating and the means for spreading, wherein the means for comparing compares a feedback clock signal with a reference clock signal, wherein the means for comparing provides the control voltage.

30. A phase locked loop circuit comprising:

a signal generator;

a spread spectrum modulator coupled to the signal generator, wherein the spread spectrum modulator comprises at least one selector, further wherein the spread spectrum modulator receives a control voltage as an input and provides a spread spectrum control voltage to the signal generator in response to the control voltage;

a detector;

a charge pump filter coupled to the detector and the spread spectrum modulator;

a loop filter coupled to the charge pump and the spread spectrum modulator;

a first divider coupled to the signal generator and a first input node of the detector, wherein the first divider receives a signal generator output signal from the signal generator and provides a first input signal to the first input node of the detector;

a second divider coupled to a second input node of the detector;

a third divider coupled to the signal generator; and wherein the second divider receives a reference clock signal and provides a second input signal to the second input node of the detector, further wherein the third divider receives the signal generator output signal from the signal generator and provides an output clock signal.

31. A phase locked loop comprising:

means for spreading a control voltage, wherein said means for spreading comprises;

a means for selecting, further wherein said means for spreading uses analog voltage controlled spread spectrum modulation and provides a spread spectrum control voltage;

means for generating a voltage waveform, wherein the means for generating a voltage waveform generates a voltage waveform in response to a high voltage and a low voltage;

means for adding, wherein the means for adding adds a reference voltage with the control voltage to provide a sum voltage; and     means for subtracting coupled to the means for adding and the means for generating a voltage waveform, wherein the means for subtracting subtracts the voltage waveform from the sum voltage to provide the spread spectrum control voltage; and means for generating an output clock signal, wherein the means for generating generates the output clock signal in response to the spread spectrum control voltage.

\* \* \* \* \*